US009570305B2

(12) United States Patent
Chang et al.

(10) Patent No.: US 9,570,305 B2
(45) Date of Patent: *Feb. 14, 2017

(54) SELF-ALIGNED DOUBLE PATTERNING

(71) Applicant: Taiwan Semiconductor Manufacturing Company, Ltd., Hsin-Chu (TW)

(72) Inventors: Yu-Sheng Chang, Taipei (TW); Chung-Ju Lee, Hsin-Chu (TW); Tien-I Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/973,373

(22) Filed: Dec. 17, 2015

(65) Prior Publication Data
US 2016/0104619 A1    Apr. 14, 2016

Related U.S. Application Data

(63) Continuation of application No. 14/056,522, filed on Oct. 17, 2013, now Pat. No. 9,230,809.

(51) Int. Cl.
*H01L 21/033* (2006.01)
*H01L 21/768* (2006.01)
*H01L 21/027* (2006.01)
*H01L 21/311* (2006.01)

(52) U.S. Cl.
CPC ....... *H01L 21/0338* (2013.01); *H01L 21/0273* (2013.01); *H01L 21/0276* (2013.01); *H01L 21/0332* (2013.01); *H01L 21/0335* (2013.01); *H01L 21/0337* (2013.01); *H01L 21/31138* (2013.01); *H01L 21/31144* (2013.01); *H01L 21/76802* (2013.01); *H01L 21/76816* (2013.01); *H01L 21/76877* (2013.01); *H01L 21/76879* (2013.01)

(58) Field of Classification Search
CPC ............. H01L 21/0337; H01L 21/0338; H01L 21/0332; H01L 21/0273; H01L 21/308; H01L 21/3081; H01L 21/0334; H01L 21/31144; H01L 21/76816; H01L 21/76802
See application file for complete search history.

(56) References Cited

U.S. PATENT DOCUMENTS

| | | | | |
|---|---|---|---|---|
| 5,893,748 A | * | 4/1999 | Lin ..................... | H01L 21/0337 257/E21.038 |
| 6,245,467 B1 | * | 6/2001 | Peng ...................... | G03F 1/144 430/311 |
| 8,394,722 B2 | * | 3/2013 | Delgadino ........ | H01L 21/31138 216/47 |
| 2004/0196579 A1 | | 10/2004 | Shoki | |

(Continued)

*Primary Examiner* — Mohsen Ahmadi
(74) *Attorney, Agent, or Firm* — Slater Matsil, LLP

(57) ABSTRACT

A system and method for a semiconductor device are provided. An embodiment comprises a dielectric layer and masking layers over the dielectric layer. A thin spacer layer is used to form spacers alongside a pattern. A reverse image of the spacer pattern is formed and an enlargement process is used to slightly widen the pattern. The widened pattern is subsequently used to pattern an underlying layer. This process may be used to form a pattern in a dielectric layer, which openings may then be filled with a conductive material.

20 Claims, 11 Drawing Sheets

(56) References Cited

U.S. PATENT DOCUMENTS

| | | |
|---|---|---|
| 2007/0148968 A1 | 6/2007 | Kwon et al. |
| 2008/0045033 A1* | 2/2008 | Wang .................. H01L 21/0271 438/736 |
| 2008/0070128 A1* | 3/2008 | Wu ........................ B82Y 10/00 430/5 |
| 2009/0215272 A1 | 8/2009 | Sadjadi et al. |
| 2010/0009470 A1 | 1/2010 | Davis et al. |
| 2010/0136784 A1 | 6/2010 | Mebarki et al. |
| 2010/0181688 A1* | 7/2010 | Yanagisawa ........ H01L 23/3107 257/787 |
| 2011/0291243 A1 | 12/2011 | Seamons et al. |
| 2012/0052683 A1* | 3/2012 | Kim .................. H01L 21/02126 438/694 |
| 2012/0122035 A1* | 5/2012 | Hsieh ................. H01L 21/76802 430/323 |
| 2013/0214391 A1* | 8/2013 | Choi ................. H01L 21/76816 257/622 |
| 2013/0264622 A1 | 10/2013 | Lin et al. |
| 2014/0273473 A1 | 9/2014 | Schmid et al. |
| 2015/0093899 A1* | 4/2015 | Huang ................ H01L 21/0337 438/692 |

\* cited by examiner

SELF-ALIGNED DOUBLE PATTERNING

This application is a continuation application of U.S. patent application Ser. No. 14/056,522, filed on Oct. 17, 2013, entitled "Self-aligned Double Patterning," which application is incorporated herein in its entirety.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely, using double-patterning lithography processes to form interconnects in a dielectric layer. The double patterning techniques discussed herein, however, may be used to form other structures in other embodiments. For example, the embodiments discussed herein may be used to form patterns for gates, redistribution lines, and/or the like.

Figure 1A:
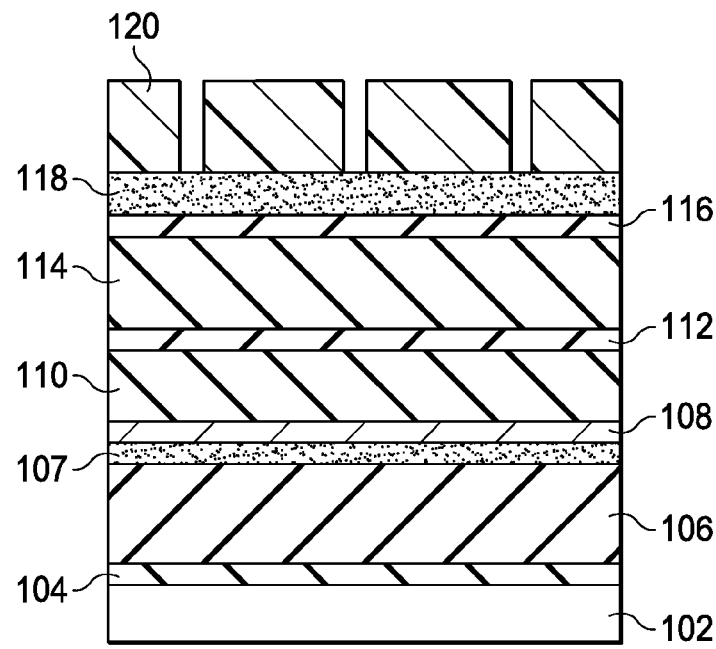
FIGS. 1A-10B illustrate various intermediate stages in a manufacture of a semiconductor device in accordance with an embodiment.

FIGS. 1A-10B illustrate various intermediate stages of a method of forming a semiconductor device in accordance with an embodiment. With reference to the figures, two views are presented for each step or steps discussed below, wherein the "A" figure is a cross-sectional view along the A-A' line in the corresponding B figure. For example, FIG. 1A is a cross-sectional view along the A-A' line in FIG. 1B.

Figure 1B:
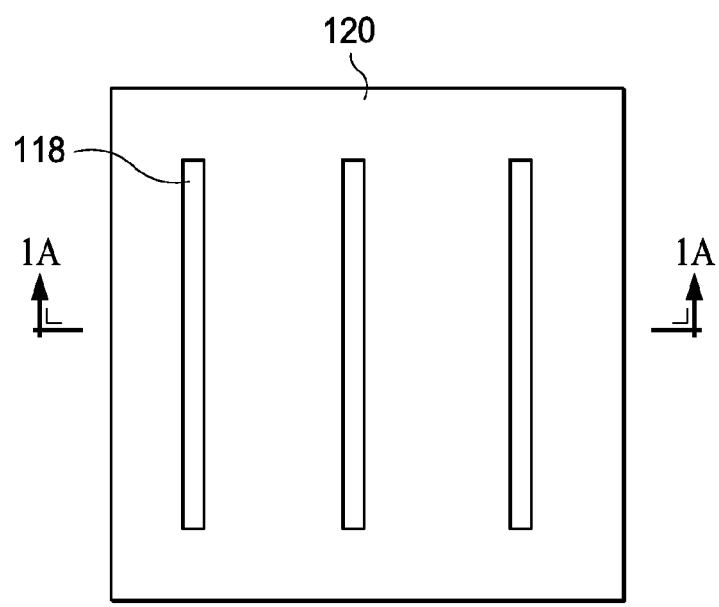

Referring first to FIGS. 1A and 1B, a portion of a substrate 102 having an overlying dielectric layer 106 is shown. As discussed in greater detail below, the dielectric layer 106 will be patterned with openings, which openings may, for example, be filled with a conductive material such as copper. It should be noted that a portion of the substrate 102 is shown and that the substrate 102 may include various other components. For example, the substrate 102 may include a semiconductor substrate having electrical circuitry formed thereon. The substrate 102 may further include various layers, such as an inter-layer dielectric (ILD) layer, one or more inter-metal dielectric (IMD) layers, and one or more metallization layers. Generally, the dielectric layers and the associated metallization layers are used to interconnect the electrical circuitry to each other and to provide an external electrical connection. As an example, the dielectric layer 106 is an ILD layer or an IMD layer in which a metallization layer is to be formed. Other embodiments may pattern other layers.

In an embodiment the dielectric layer 106 is formed of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). It should also be noted that the dielectric layer 106 may comprise a plurality of dielectric layers.

As shown in FIG. 1A, a first etch stop layer (ESL) 104 may be interposed between the substrate 102 and the dielectric layer 106. The first ESL 104 may comprise a dielectric material, such as silicon nitride, silicon oxynitride, silicon oxycarbide, silicon carbide, combinations thereof, and multi-layers thereof, and may be formed using suitable deposition techniques such as sputtering, CVD and the like. Generally, the first ESL 104 is formed of a material exhibiting a low etch rate as compared to the overlying material. For example, in the embodiment illustrated in FIG. 1A, the dielectric layer 106 is to be etched and the first ESL 104 will act as an etch stop. In this situation, the material used to form the first ESL 104 is selected such that the first ESL 104 will have a lower etch rate than the material of the dielectric layer 106. In this manner, the etch process essentially stops at the first ESL 104 due to the low etch rate.

Over the dielectric layer 106 is first anti-reflective coating (ARC) 107 and a first mask layer 108 as illustrated in FIG. 1A. The first mask layer 108, as described below, will be patterned using a series of additional masks and double patterning techniques. The first mask layer 108 may be formed of titanium, tantalum, titanium nitride, tantalum nitride, or the like, using, for example, blanket deposition techniques.

The first ARC 107 prevents radiation in a subsequent photolithographic process to reflecting off layers below and interfering with the exposure process. Such interference can increase the critical dimension of the photolithography process. In an embodiment, the first ARC 107 is a nitrogen-free ARC (NFARC), and comprises materials such as carbon and oxygen, and may be formed by CVD, a spin-on process, the like, or a combination thereof. The first ARC layer 107 has a thickness sufficient to provide sufficient antireflective qualities based upon the materials and the wavelength. In an embodiment, the first ARC layer 107 is formed to a thickness of between about 50 Å and about 2000 Å.

A first advanced patterning film (APF) 110, a second ESL 112, a second APF 114, and a second mask 116 are formed over the first mask layer 108. In an embodiment, these layers in combination will be used to pattern the first mask layer for critical dimension control in order to obtain and control the desired dimensions of the patterning of the first mask layer 108. In an embodiment, the first APF layer 110 and the second APF layer 114 are masking layers and may each comprise amorphous carbon formed by a CVD process, although other suitable materials and methods of formation may alternatively be utilized, and the first APF layer 110 and the second APF layer 114 may be formed of different materials and/or different processes. The thickness of the first APF layer 110 and the second APF layer 114 may be adjusted such that each of the layers has sufficient thickness during the respective etching processes (discussed below) to protect the underlying material. In an embodiment, the first APF layer 110 is formed to a thickness of between about 100 Å and about 2000 Å, such as about 1000 Å, and the second APF layer 114 is formed to a thickness of between about 100 Å and about 2000 Å, such as about 800 Å. Other thicknesses may be used.

The second ESL 112 may be formed over the first APF layer 110 and the second mask 116 may be formed over the second APF layer 114 to aid in patterning the respective APF layers. The second ESL 112 and the second mask 116 may be a masking material such as silicon oxynitride, although other suitable materials, such as silicon oxide or silicon nitride, may alternatively be utilized, and may be formed by a process such as atomic layer deposition (ALD). However, any other suitable processes and thicknesses may alternatively be utilized. In an embodiment, the second ESL 112 is formed to a thickness of between about 50 Å and about 1000 Å, such as about 300 Å, and the second mask 116 is formed to a thickness of between about 50 Å and about 1000 Å, such as about 200 Å. Other thicknesses may be used.

Optionally, a bottom anti-reflective coating (BARC) layer 118 may be formed over the second mask 116 to aid in a subsequent photolithographic process to pattern an overlying layer, such as the patterned mask 120. The BARC layer 118 may comprise SiON, a polymer, the like, or a combination thereof and may be formed by CVD, a spin-on process, the like, or a combination thereof. The BARC layer 118 has a thickness sufficient to provide sufficient antireflective qualities based upon the materials and the wavelength. In an embodiment, the BARC layer 118 is formed to a thickness of between about 100 Å and about 2000 Å.

Also shown in FIG. 1A is a patterned mask 120 formed over the BARC layer 118. In an embodiment, the patterned mask 120 comprises a photo resist material and is patterned using photolithography techniques. Generally, a photoresist material is irradiated (exposed) and developed to remove a portion of the photoresist material. The remaining photoresist material protects the underlying material from subsequent processing steps, such as etching. As discussed above, patterns that may be obtained using a single photolithography process are limited. As explained below, multiple photolithography processes are utilized to pattern the first mask layer 108, which is subsequently used to pattern the underlying dielectric layer 106.

The patterned mask 120 may comprise a photoresist material, such as a deep ultra-violet (DUV) photoresist, and may be deposited on the surface of the BARC layer 118, for example, by using a spin-on process. However, any other suitable materials or methods may be used. Once the photoresist material has been placed on the BARC layer 118, photoresist material may be exposed to energy, e.g. light, through a patterned reticle in order to induce a reaction in those portions of the photoresist material exposed to the energy. The photoresist material may then be developed, and portions of the photoresist material may be removed, exposing a surface of the BARC layer 118 as illustrated in FIG. 1A.

Figure 2A:
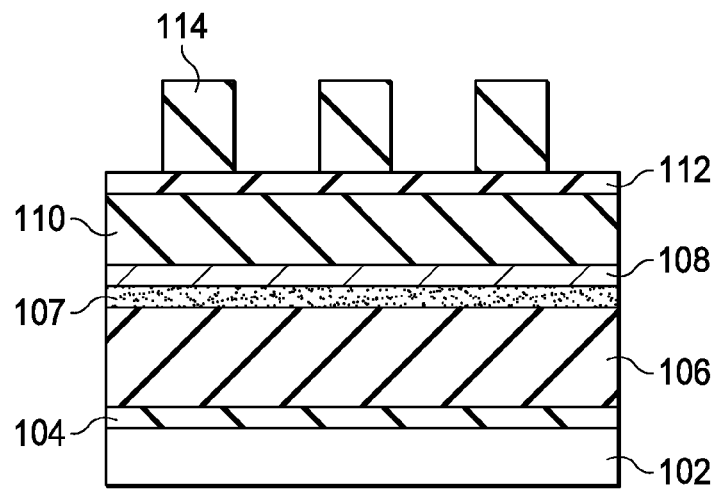
Figure 2B:
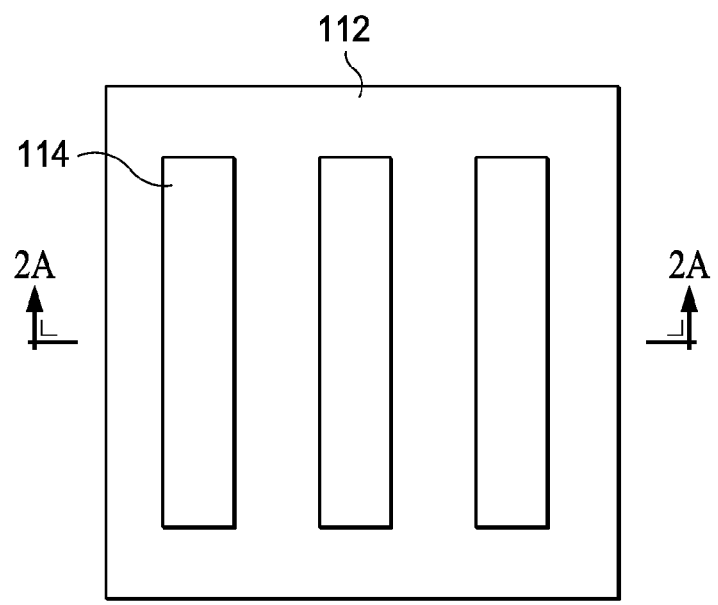

FIGS. 2A and 2B illustrate the resulting structure after the pattern has been transferred to the second APF 114. In an embodiment in which the second APF 114 is formed of amorphous carbon, the pattern may be transferred to the second APF 114 using a dry etch using a mixture of $H_2/N_2/CO$. In the embodiment illustrated in FIGS. 2A and 2B, after patterning the second APF 114 exhibits a line pattern, resembling a series of fins extending from the planar surface. In other embodiments, however, other patterns may be utilized dependent upon the desired design and application. Any remaining portions of the second mask 116, the BARC layer 118, and/or the patterned mask may be stripped off.

Figure 3A:
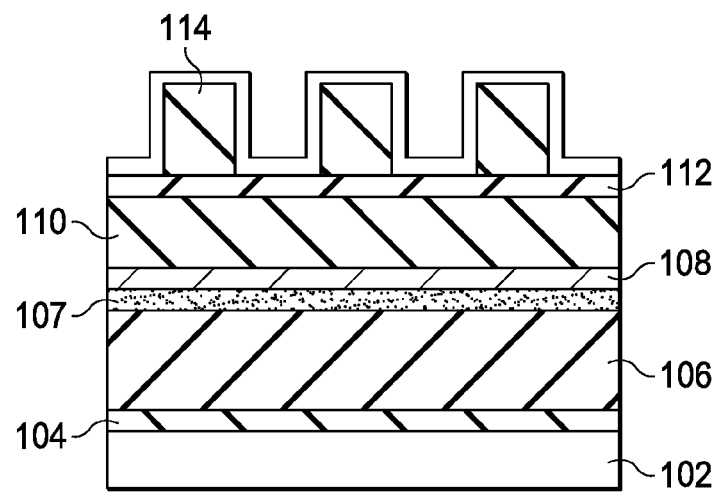
Figure 3B:
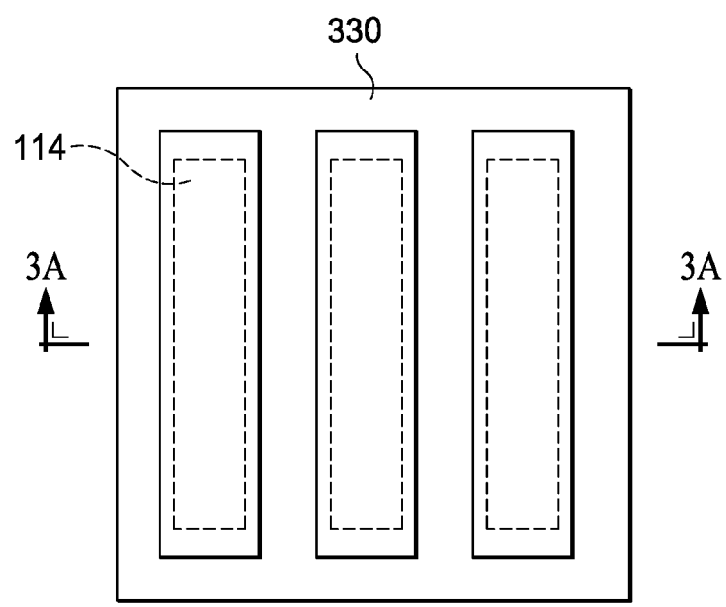

FIGS. 3A and 3B illustrate a spacer layer 330 formed over the patterned second APF 114 in accordance with an embodiment. As discussed in greater detail below, the spacer layer 330 is formed as a conformal layer over the second ESL 112 and the second APF 114. A subsequent etch will be performed to remove the spacer layer 330 from the horizontal surfaces, leaving spacers formed along the sidewalls of the patterned second APF 114. These spacers will in turn be patterned in a cut lithography process to form the desired pattern.

As explained in greater detail below, the cut lithography process frequently results in extensions or protrusions extending from the pattern, which protrusions may result in gap filling issues. Embodiments such as those disclosed herein reduce or avoid these extensions or protrusions by forming a thin spacer layer, resulting in a thinner spacer than may be desired in a final pattern. A reverse image is created as described below, and an enlargement process will be used to widen the pattern in the reverse image, wherein the enlargement process reduces the extensions or protrusions and accordingly, reduces the gap filling issues.

In an embodiment, the spacer layer 330 may be formed of silicon nitride using PECVD, although other materials such as nitride, oxynitride, carbide, boride, combinations thereof, or the like, and alternative techniques of forming the spacer layer 330, such as low pressure CVD (LPCVD), PVD, ALD, or the like, could alternatively be used. The spacer layer 330 may have a thickness of between about 5 nm and about 50 nm, such as about 16 nm. In an embodiment, the thickness of the spacer layer 330 is less than the technology node.

Figure 4A:
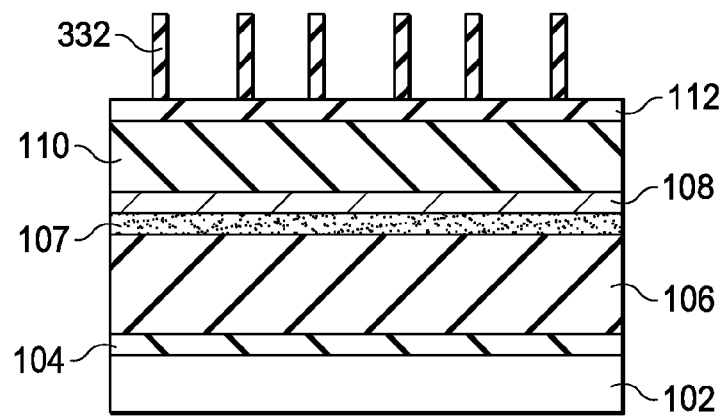
Figure 4B:
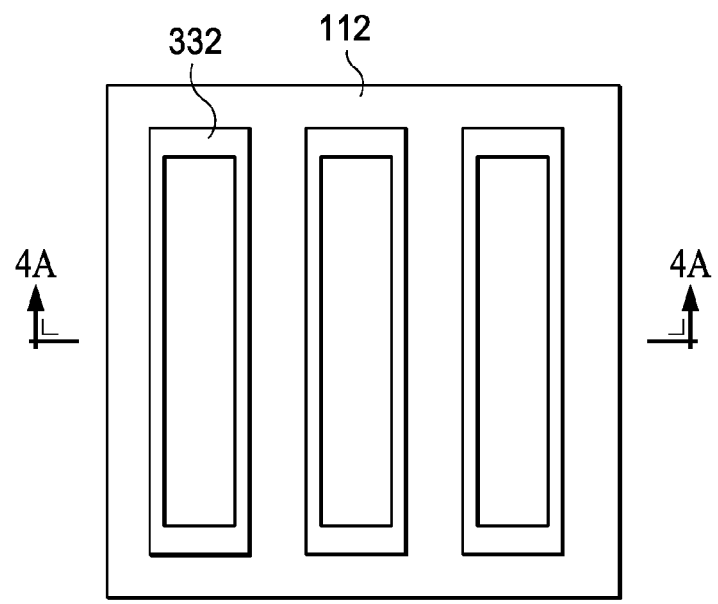

Referring next to FIGS. 4A and 4B, the spacer layer 330 is removed from the horizontal surfaces of the second ESL 112 and the second APF 114, opening the patterned second APF 114. In an embodiment in which the spacer layer 330 is formed of silicon nitride and the second APF 114 is formed of amorphous carbon, the spacer layer 330 may be etched using a dry etch process. A dry etch process such as this removes the spacer layer 330 from the horizontal surfaces. Because the spacer layer 330 has a greater thickness along the sidewalls of the patterned second APF 114 (see FIG. 3A), portions of the spacer layer 330 remain along the sidewalls of the patterned second APF 114.

As a result of the etch process, the upper surface of remaining portions of the second APF 114 is exposed and may be removed, for example, by an ashing process, as illustrated in FIGS. 4A and 4B. In an embodiment in which the second APF 114 is formed of amorphous carbon, the ashing process may utilize an $O_2$ plasma. As a result of the ashing process, the amorphous carbon of the second APF 114 is removed, leaving a spacer pattern 332 formed by remaining portions of the spacer layer 330, which form rings as illustrated in FIG. 4B.

Figure 5A:
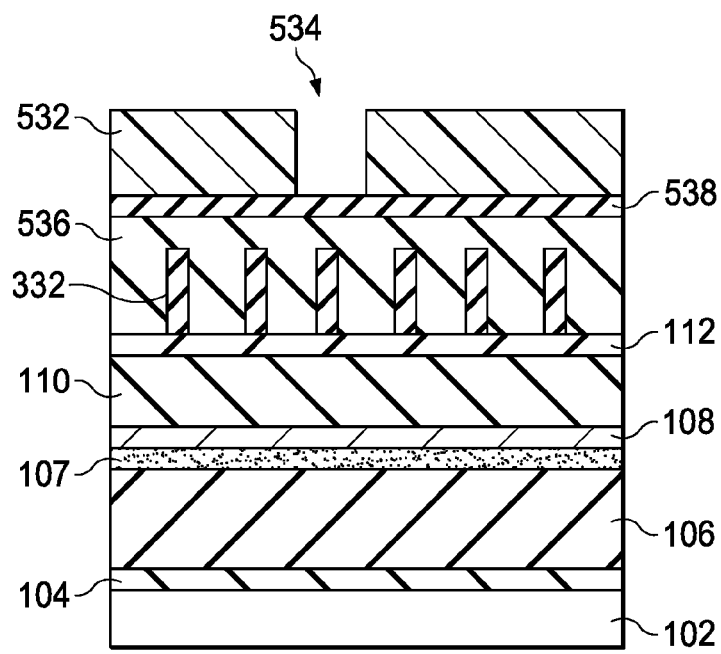
Figure 5B:
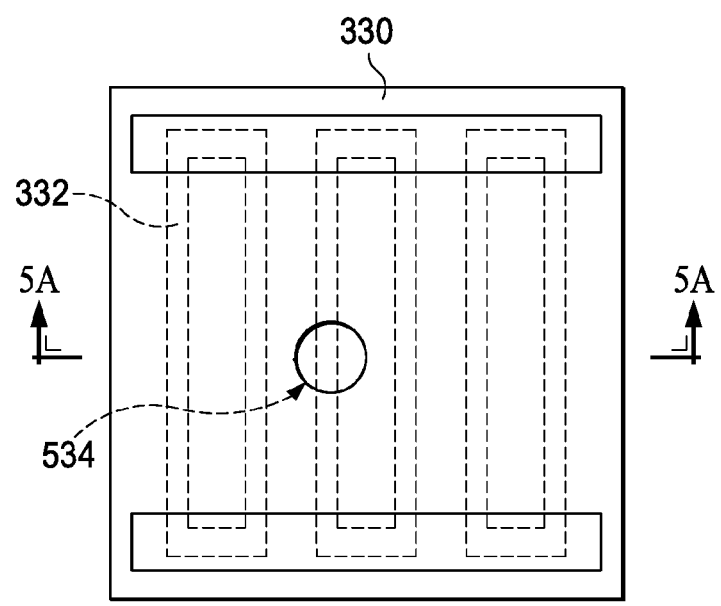

FIGS. 5A and 5B illustrate a cut lithography mask 532 formed over the spacer layer 330 in accordance with an embodiment. Due to the limits of lithography, multiple lithography processes are utilized to define the features in this embodiment, thereby allowing more accurate shapes. As illustrated in FIG. 4B, the spacer pattern 332 forms continuous elongated rings. The cut lithography mask 532 is utilized to remove the ends of the rings of the spacer pattern 332 to form line patterns. Additionally, the cut lithography mask 532 may include open portions (such as open portion 534 of FIGS. 5A and 5B) to further cut a line to alter the length of a line or to divide a line of the spacer pattern 332 into multiple lines.

It is noted that the open portion 534 is illustrated as a circular or elliptical shape. Due to the lithography limits, masks having shapes with square corners are often transferred to the photoresist mask with rounded corners. As the sizes of the mask shape decrease, the rounded corners often results in a circular or elliptical shape transferred to the photoresist.

The cut lithography mask 532 may comprise a photoresist material, such as a DUV photoresist, and may be deposited by, for example, using a spin-on process. However, any other suitable materials or methods may be used. Once the photoresist material has been formed, photoresist material may be exposed and developed to form the cut lithography mask 532 as illustrated in FIGS. 5A and 5B.

Optionally, a masking layer, such as a photoresist material bottom layer 536 and a third mask layer 538 may be used to aid in the cut lithography process. The photoresist material bottom layer 536 may be deposited by, for example, using a spin-on process, although other suitable materials and methods of formation may alternatively be utilized. The thickness of the photoresist material bottom layer 536 may be adjusted such that it has sufficient thickness during the etching process to protect the underlying material. In an embodiment, the photoresist material bottom layer 536 is formed to a thickness of between about 200 Å and about 2000 Å, such as about 1000 Å. Other thicknesses may be used.

The third mask layer 538, which acts as a photoresist material middle layer, may comprise a silicon content photoresist material, be deposited by, for example, using a spin-on process, or other materials having a sufficient etch rate selectivity between the photoresist material bottom layer 536 and the spacer pattern 332 to satisfactorily etch selected portions of the spacer pattern 332.

Figure 6A:
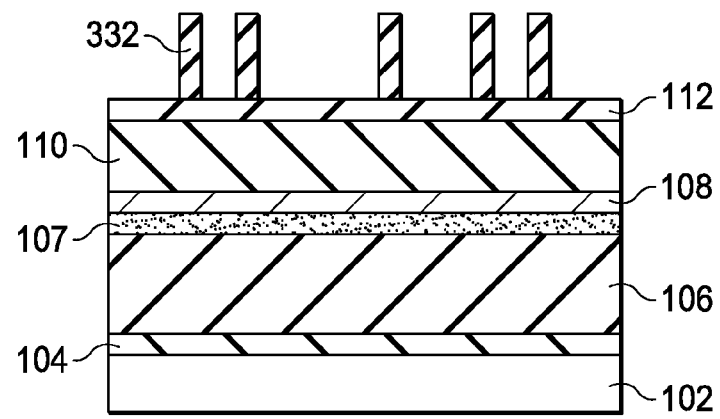
Figure 6B:
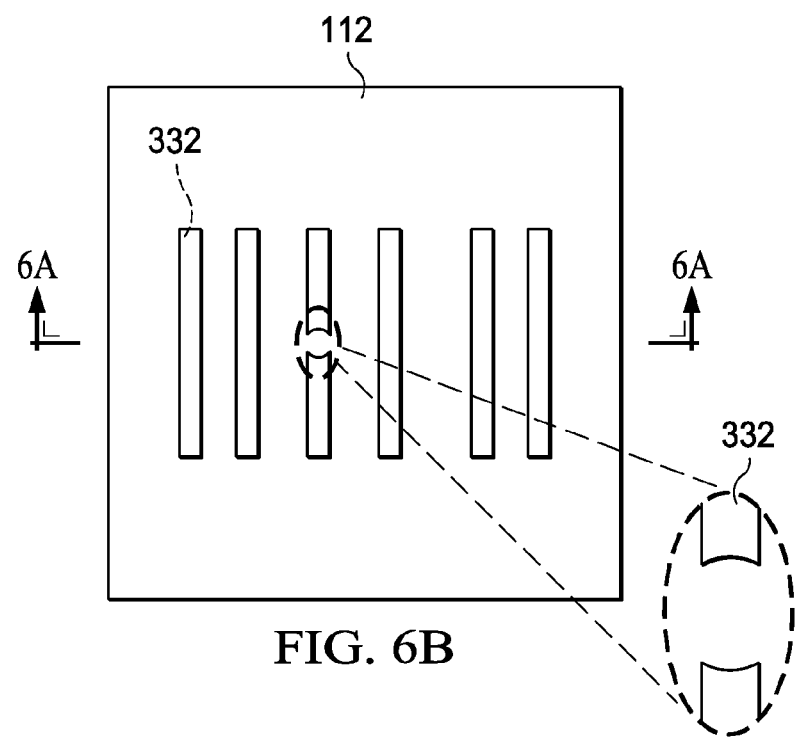

FIGS. 6A and 6B illustrate the spacer pattern 332 after the cut etch process in accordance with an embodiment. In an embodiment in which the spacer pattern 332 is formed of silicon nitride, the spacer pattern 332 may be etched using a dry etch process using, for example $CF_4$, $C_xF_y$, or the like. As illustrated in the inset of FIG. 6B, the cut etch process may result in protrusions extending out at the corners of the spacer pattern 332. When transferred to the underlying layers, it has been found that these rounded ends or protrusions may result in gap filling issues in subsequent processes.

Figure 7A:
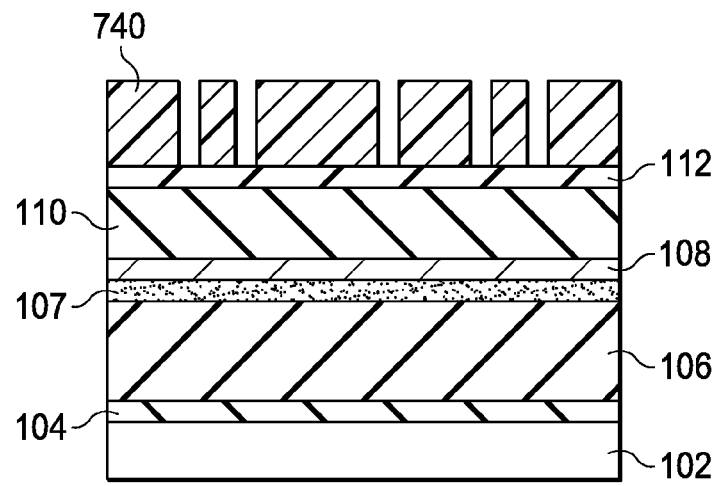
Figure 7B:
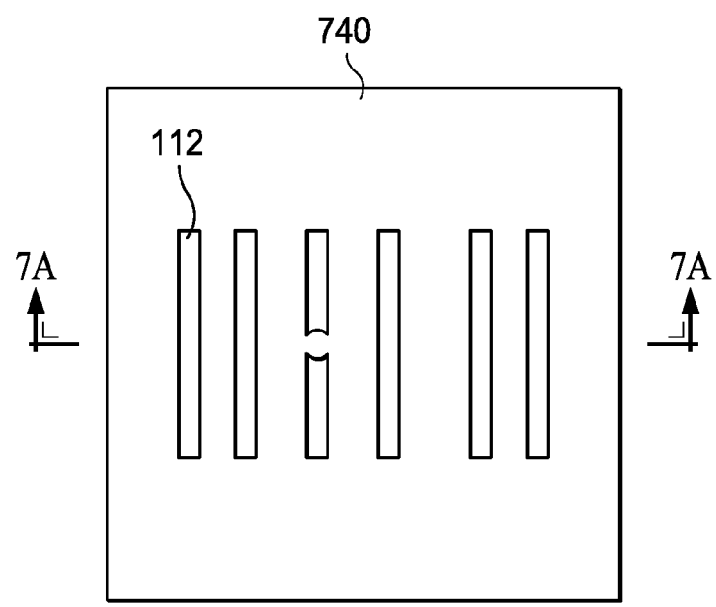

FIGS. 7A and 7B illustrate a fourth mask layer 740 formed between the spacer pattern 332 (see FIGS. 6A and 6B), and the subsequent removal of the spacer pattern 332 in accordance with an embodiment. Generally, a reverse image of the spacer pattern 332 is created by first forming a layer of material over the spacer pattern 332 such that the spacer pattern 332 is exposed and subsequently removing the spacer pattern 332. As explained in greater detail below, an enlargement process will then be performed on this reverse image.

In an embodiment, the fourth mask 740 comprises a photoresist material, or other materials having a sufficient etch selectivity with the materials used to form the spacer pattern 332. As discussed above and illustrated in FIG. 7A, the spacer pattern 332 is removed, leaving the fourth mask 740. As such, the materials selected for the fourth mask 740 and the spacer pattern 332 are selected such that the spacer pattern 332 may be removed while limiting the damage, if any, to the fourth mask 740. In an embodiment in which the spacer pattern 332 is formed of silicon nitride, the fourth mask 740 may be a spin-on photoresist bottom layer. The fourth mask 740 is formed to a thickness sufficient to cover the spacer pattern 332. A subsequent isotropic dry etch process may be used to uniformly thin the fourth mask 740 and expose the spacer pattern 332, which may be removed using, for example, a dry etch with $CF_4$, $C_xF_y$, or the like.

Figure 8A:
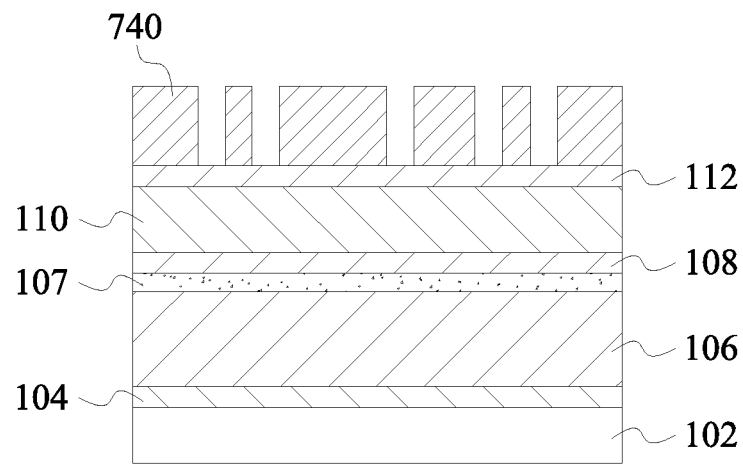
Figure 8B:
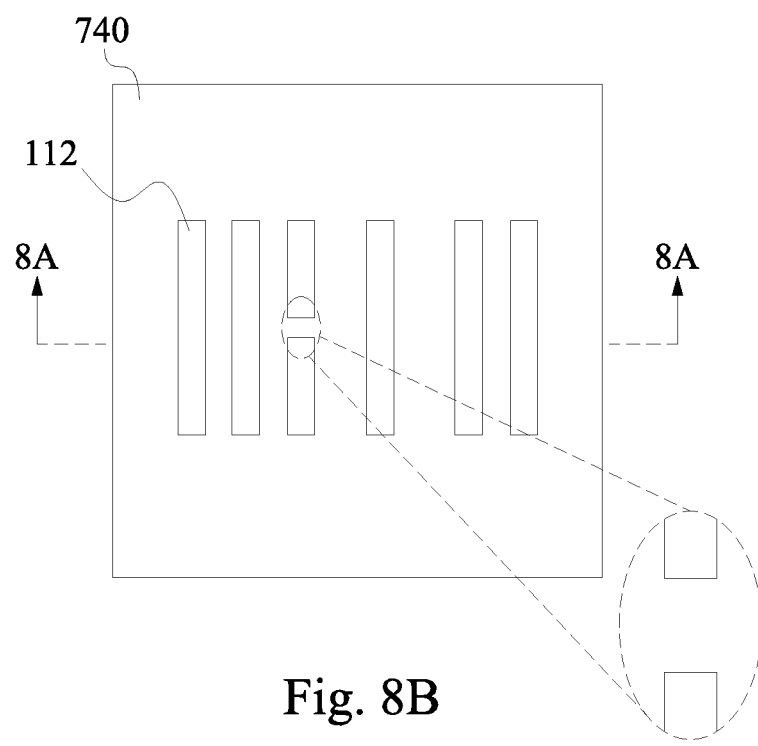

FIGS. 8A and 8B illustrate the resulting structures after performing an enlargement process in accordance with an embodiment. As noted above with reference to FIGS. 6A and 6B, the cut profile may result in a curved end with pointed protrusions. It has been found that the profile such as this can result in gap filling issues. Performing an enlargement process such as those disclosed herein slightly enlarges the openings and can remove or reduce the narrow protrusions resulting from the rounded etch profile. Patterns such as those achieved by the enlargement process can provide better gap filling qualities, thereby providing higher reliability and consistent devices. As noted above, because of the enlargement process, a thinner spacer layer may be formed than desired in the final pattern. The subsequent enlargement process increases the width of the pattern to the desired width.

In an embodiment, the enlargement process comprises a plasma etch process using $O_2$, $CO_2$, $N_2/H_2$ or the like. For example, in an embodiment in which the fourth mask 740 comprises a photoresist material, the enlargement process may use an $O_2$ flow rate of about 2 sccm to about 1000 sccm at a pressure of about 3 mTorr to about 1000 mTorr and at power of about 50 Watts to about 1000 Watts and at a temperature of about 10° C. to about 70° C., for example. As an example, the enlargement process may be performed using an $O_2$ flow rate of 100 sccm at a pressure of about 100 mTorr and a power of about 200 Watts.

Figure 9A:
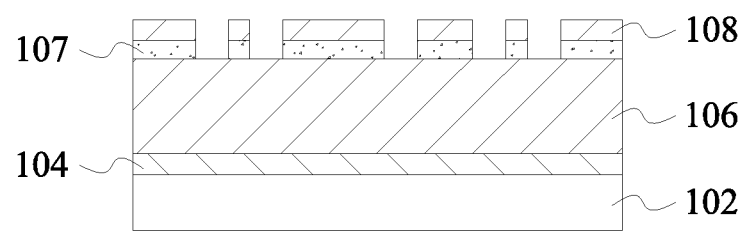
Figure 9B:
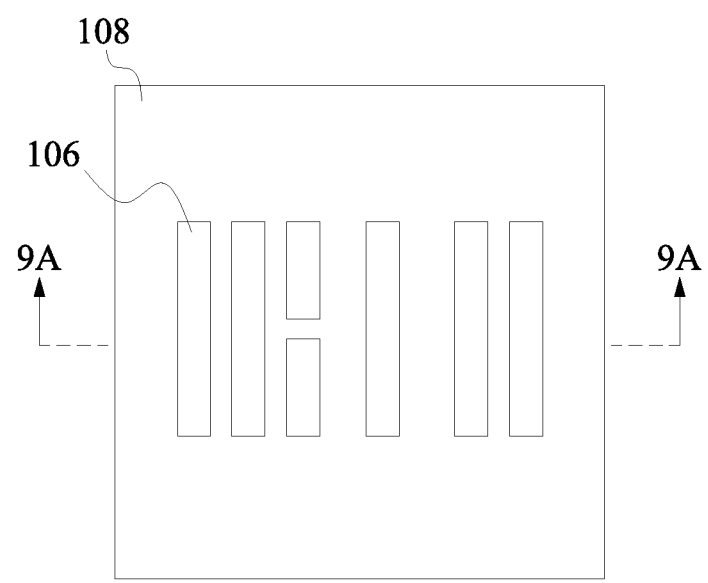

Thereafter, as illustrated in FIGS. 9A and 9B, the pattern formed in the fourth mask 740 (see FIGS. 8A and 8B) is transferred to the first mask layer 108 and first ARC 107 in accordance with an embodiment. The first mask layer 108 may be patterned by a dry chemical etch with a plasma source, such as $Cl_2$, and the ARC 107 may be patterned by a dry etch with $CF_4$ or $C_xF_y$. The plasma source may be an inductively coupled plasma (ICR) etch, a transformer coupled plasma (TCP) etch, an electron cyclotron resonance (ECR) etch, a reactive ion etch (RIE), or the like. In the dry chemical etch, reactive ions are directed towards the first mask layer 108 with the overlying patterned first APF 110. With the patterned first APF 110 overlying the first mask layer 108, the patterned first APF 110 will block the reactive ions, thereby allowing reactions to occur where the first mask layer 108 is exposed by the patterned first APF 110, thereby transferring the pattern of the first APF 110 to the first mask layer 108. Other processes may be used.

Figure 10A:
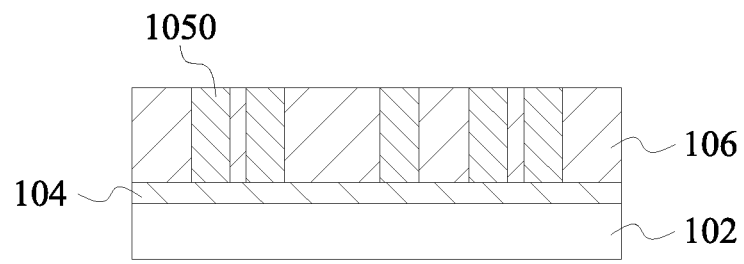
Figure 10B:
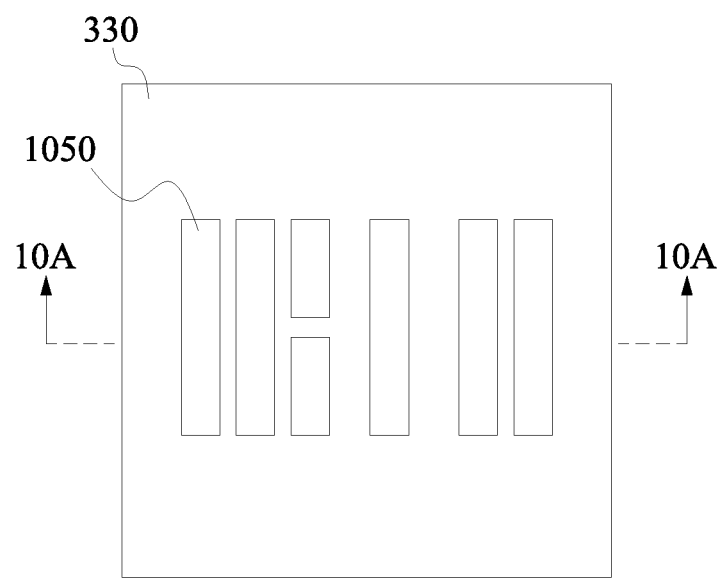

Thereafter, other processes may be performed. For example, FIGS. 10A and 10B illustrate transferring the pattern of the first mask layer 108 into the underlying dielectric layer 106 and a subsequent fill process to form conductive lines 1050. In this example, the dielectric layer 106 is etched using the patterned first mask layer 108 as a mask, thereby forming openings in the dielectric layer 106. Once etched, the openings are filled with a conductive material. In an embodiment the openings are filled with copper, although other suitably conductive material may alternatively be utilized. The conductive lines 1050 may be formed using a damascene process, by which a portion of the dielectric layer 106 is removed to form an opening, the opening is filled and overfilled with the conductive material, such as copper. The overfilled conductive material may be removed using, for example, a planarization process (e.g., a CMP process), an etch process, or other suitable processes.

The conductive lines 1050 may comprise copper, although other suitable materials such as aluminum, alloys, doped polysilicon, combinations thereof, and the like, may alternatively be utilized. Optionally, the openings may be lined with a liner (not individually illustrated in FIGS. 10A and 10B) prior to filling with a conductive material. The liner may be, e.g., an oxide formed from tetraethylorthosilicate (TEOS) or silicon nitride, although any suitable dielectric material may alternatively be used. The liner may be formed using a PECVD process, although other suitable processes, such as physical vapor deposition or a thermal process, may alternatively be used.

Figure 11:
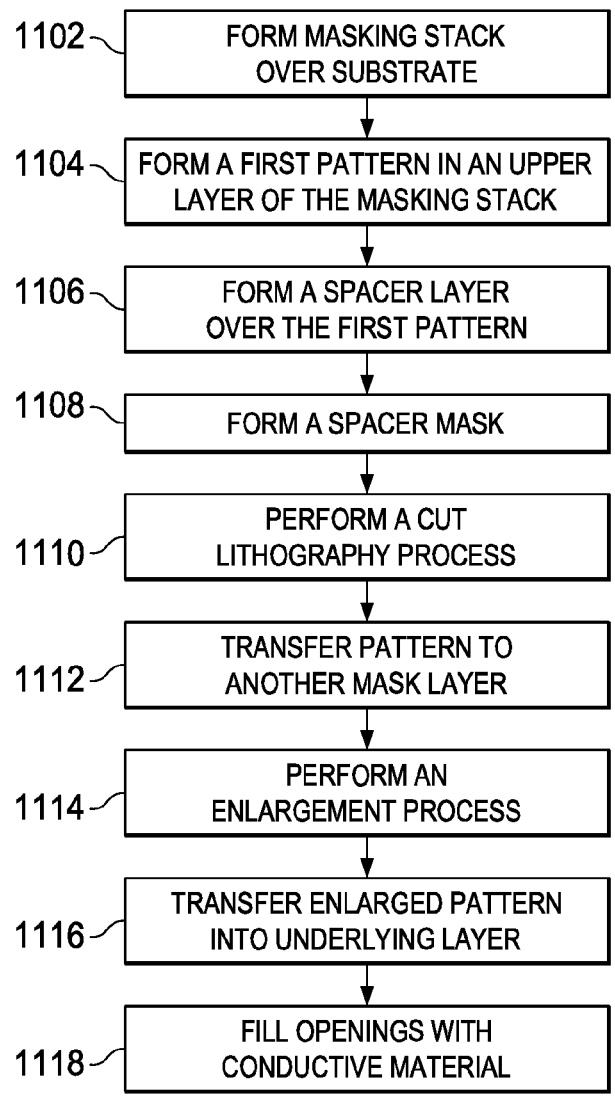
FIG. 11 is a flowchart illustrating a method of forming a semiconductor device in accordance with an embodiment.

FIG. 11 is a flowchart illustrating a method that may be performed in accordance with an embodiment. The method begins at step 1102, wherein a masking stack is formed over a substrate. FIG. 1A illustrates an example in which a masking stack, including APFs, ESLs, ARCs and the like are formed over a dielectric layer, which is the layer in which the pattern is desired to be formed. The masking stack will be subject to double patterning techniques as described above.

In step 1104, a first pattern is formed in an upper layer of the masking stack, such as that discussed above with reference to FIGS. 1A-2B, and in step 1106, a thin spacer layer is formed over the first pattern, such as that discussed above with reference to FIGS. 3A-3B. The thin spacer layer is etched to leave thin spacers along sidewalls of the first pattern, thereby creating a spacer mask, in step 1108. A cut lithography process is performed in step 1110 to cut the edges and open portions of the line in accordance with a desired pattern, such as that discussed above with reference to FIGS. 5A-6B.

In step 1112, the pattern is transferred to another mask layer by, for example, forming a masking layer over the spacer mask pattern, and then removing the spacer mask pattern, leaving openings in the new masking layer corresponding to the spacer mask pattern, such as that illustrated above with reference to FIGS. 7A and 7B. In step 1114, an enlargement process is performed, such as that discussed above with reference to FIGS. 8A and 8B. The enlargement process aids in gap filling during a subsequent filling process.

In step 1116, the enlarged pattern is transferred into an underlying layer, such as a dielectric layer as discussed above with reference to FIGS. 9A and 9B, thereby leaving openings in the underlying layer. The openings are filled with a conductive material in step 1118, such as that discussed above with reference to FIGS. 10A and 10B.

In accordance with an embodiment, a method of manufacturing a semiconductor device is provided. The method comprises forming a first mask over a substrate such that the first mask has first openings formed therein to expose an underlying layer. An enlargement process is used to widen the first openings in the first mask, thereby creating an enlarged pattern. Thereafter, the enlarged pattern is transferred to the underlying layer, thereby forming second openings in the underlying layer. Subsequently, the second openings may be filled with a conductive material.

In accordance with another embodiment, a method of manufacturing a semiconductor device is provided. The method comprises providing a substrate, depositing a first masking layer over the substrate, and patterning the first masking layer, thereby forming a first patterned layer. Spacers are formed along sidewalls of the first patterned layer, and the second patterned layer is removed. Another patterning process is performed to further pattern the spacers to remove at least a portion of the spacers. A second masking layer is formed over the spacers such that the spacers are exposed, and the spacers are removed, thereby forming a second pattern with first openings in the second masking layer such that the first openings have a first width. The first openings are enlarged to form a third pattern with second openings, the second openings having a second width, the second width being greater than the first width. The third pattern is then transferred to the substrate.

Although the present embodiments and their advantages have been described in detail, it should be understood that various changes, substitutions and alterations can be made herein without departing from the spirit and scope of the disclosure as defined by the appended claims. For example, different materials and different processes may be utilized to form the various layers.

In an embodiment, a method of manufacturing a semiconductor device is provided. The method includes forming a first patterned mask layer, the first patterned mask layer having a first opening and a second opening, the first opening and the second opening being co-linear, a first end of the first opening having a first center region and first side regions on opposing sides of the first center region, the first side regions extending away from the first center region toward the second opening. An enlargement process is performed to reduce a distance the first side regions extend from the first center region, thereby forming an enlarged pattern, and after the performing the enlargement process, the enlarged pattern is transferred to an underlying layer, thereby forming openings in the underlying layer.

In an embodiment, a method of manufacturing a semiconductor device is provided. The method includes forming a first line pattern, cutting the first line pattern to form a second line pattern and a third line pattern, the second line pattern and the third line pattern, the second line pattern and the third line pattern having concave ends, and forming a first mask layer along sidewalls of the second line pattern and the third line pattern, wherein the second line pattern and the third line pattern are exposed. The second line pattern and the third line pattern is removed, thereby forming a first line opening and a second line opening, the first line opening and the second line opening having concave ends corresponding to the concave ends of the second line pattern and the third line pattern, and the first line opening and the second line opening are enlarged, the enlarging reducing a curvature of the concave ends of the first line opening and the second line opening.

In an embodiment, a method of manufacturing a semiconductor device is provided. The method includes forming a dielectric layer over a substrate, forming a first masking layer over the dielectric layer, and forming a second masking layer over the first masking layer, the second masking layer having a first opening and a second opening, the first opening and the second opening having concave ends. A first process is performed to reduce a curvature of the concave ends. The method further includes etching the first masking layer using the second masking layer as a first mask, etching the dielectric layer using the first masking layer as a second mask, thereby forming a third opening and a fourth opening in the dielectric layer, and filling the third opening and the fourth opening in the dielectric layer with a conductive material.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a first patterned mask layer, the first patterned mask layer having a first opening and a second opening, the first opening having a first longitudinal axis and the second opening having a second longitudinal axis, the first opening and the second opening are aligned along a same longitudinal axis in a plan view, the first opening and the second opening having projections extending toward one another in the plan view, a first end of the first opening having a first center region and first side regions on opposing sides of the first center region, the first side regions extending away from the first center region and extending toward the second opening in the plan view;
    performing an enlargement process to reduce a distance the first side regions extend from the first center region, thereby forming an enlarged pattern; and
    after the performing the enlargement process, transferring the enlarged pattern to an underlying layer, thereby forming openings in the underlying layer.

2. The method of claim 1, wherein the enlargement process comprises a plasma process.

3. The method of claim 2, wherein the plasma process comprises using $O_2$, $CO_2$, or $N_2/H_2$.

4. The method of claim 3, wherein the plasma process comprises using $O_2$ at a flow rate of about 2 sccm to about 1000 sccm, at a pressure of about 3 mTorr to about 1000 mTorr, at power of about 50 Watts to about 1000 Watts, and at a temperature of about 10° C. to about 70° C.

5. The method of claim 3, wherein the plasma process comprises using $O_2$ at a flow rate of 100 sccm at a pressure of about 100 mTorr and a power of about 200 Watts.

6. The method of claim 1, wherein the performing an enlargement process comprises enlarging the first opening to about 24 nm.

7. A method of manufacturing a semiconductor device, the method comprising:
    forming a first line pattern;
    cutting the first line pattern to form a second line pattern and a third line pattern, the second line pattern and the third line pattern having concave ends in a plan view;
    forming a first mask layer along sidewalls of the second line pattern and the third line pattern, wherein the second line pattern and the third line pattern are exposed;
    removing the second line pattern and the third line pattern, thereby forming a first line opening and a second line opening, the first line opening and the second line opening having concave ends in a plan view corresponding to the concave ends in the plan view of the second line pattern and the third line pattern; and
    enlarging the first line opening and the second line opening, the enlarging reducing a curvature of the concave ends in the plan view of the first line opening and the second line opening.

8. The method of claim 7, further comprising transferring the first line opening and the second line opening into an underlying dielectric layer to form a third line opening and a fourth line opening in the underlying dielectric layer.

9. The method of claim 8, further comprising filling third line opening and the fourth line opening with a conductive material.

10. The method of claim 9, wherein the underlying dielectric layer is a low-k dielectric layer.

11. The method of claim 7, wherein the enlarging comprises a plasma process using $O_2$ at a flow rate of about 2 sccm to about 1000 sccm, at a pressure of about 3 mTorr to about 1000 mTorr, at power of about 50 Watts to about 1000 Watts, and at a temperature of about 10° C. to about 70° C.

12. The method of claim 7, wherein the enlarging comprises a plasma process using $O_2$ at a flow rate of 100 sccm at a pressure of about 100 mTorr and a power of about 200 Watts.

13. A method of manufacturing a semiconductor device, the method comprising:
    forming a dielectric layer over a substrate;
    forming a first masking layer over the dielectric layer;
    forming a second masking layer over the first masking layer, the second masking layer having a first opening and a second opening, the first opening and the second opening having concave ends in a plan view;
    performing a first process to reduce a curvature of the concave ends in the plan view;
    etching the first masking layer using the second masking layer as a first mask;
    etching the dielectric layer using the first masking layer as a second mask, thereby forming a third opening and a fourth opening in the dielectric layer; and
    filling the third opening and the fourth opening in the dielectric layer with a conductive material.

14. The method of claim 13, wherein forming the second masking layer comprises:
    forming a third masking layer over the first masking layer;
    patterning the third masking layer to form a plurality of lines;
    forming spacers along sidewalls of the plurality of lines;
    removing the third masking layer;
    patterning the spacers to remove at least a portion of the spacers, the patterning cutting at least one of the plurality of lines to form a first line and a second line;
    forming a fourth masking layer over the spacers such that the spacers are exposed; and removing the spacers, thereby forming the second masking layer, wherein the first line corresponds to the first opening and the second line corresponds to the second opening.

15. The method of claim 13, wherein the first process enlarges the first opening and the second opening.

16. The method of claim 13, wherein the first masking layer comprises a first antireflective coating and a first hard mask layer over the first antireflective coating.

17. The method of claim 16, wherein the first masking layer further comprises an advance patterning film over the first hard mask layer and a first etch stop layer over the advance patterning film.

18. The method of claim 17, further comprising forming a second etch stop layer over the substrate, wherein the dielectric layer is formed over the second etch stop layer.

19. The method of claim 18, wherein the first process comprises a plasma process.

20. The method of claim 19, wherein the plasma process comprises using $O_2$, $CO_2$, or $N_2/H_2$.

* * * * *